United States Patent [19]

Challen

[11] 4,158,180

[45] Jun. 12, 1979

[54] TEMPERATURE CONTROL CIRCUIT

[75] Inventor: Richard F. Challen, Lynchburg, Va.

[73] Assignee: General Electric Company, Lynchburg, Va.

[21] Appl. No.: 896,033

[22] Filed: Apr. 13, 1978

[51] Int. Cl.² .............................................. H03G 3/20
[52] U.S. Cl. .................................. 330/298; 325/150; 330/207 P
[58] Field of Search ............... 325/150, 151, 185, 186; 330/207 P, 289, 298; 328/11, 259; 331/62; 361/106

[56] References Cited

U.S. PATENT DOCUMENTS

| | | | |
|---|---|---|---|
| 3,449,680 | 6/1969 | Schilb | 325/151 X |
| 3,641,451 | 2/1972 | Hollingsworth et al. | 330/298 |
| 3,866,136 | 2/1975 | Augustin et al. | 330/298 |
| 4,019,150 | 4/1977 | Lurey et al. | 330/207 P |
| 4,041,396 | 8/1977 | Fedde | 325/150 |
| 4,122,400 | 10/1978 | Medendorp et al. | 330/207 P |

*Primary Examiner*—Robert L. Griffin
*Assistant Examiner*—Jin F. Ng
*Attorney, Agent, or Firm*—James J. Williams

[57] ABSTRACT

A radio transmitter power amplifier is connected to a driver circuit whose drive power determines the output power of the power amplifier. Direct current is supplied to the driver circuit under the control of a temperature control circuit which compares a temperature indicative voltage with a voltage indicative of the direct current drawn by the power amplifier. If the power amplifier direct current is above a desired level for a given temperature, the control circuit reduces the direct current supplied to the driver circuit, and hence reduces the output power of the power amplifier. If the power amplifier direct current is below a desired level for a given temperature, the control circuit increases the direct current supplied to the driver circuit, and hence increases the output power of the power amplifier.

9 Claims, 2 Drawing Figures

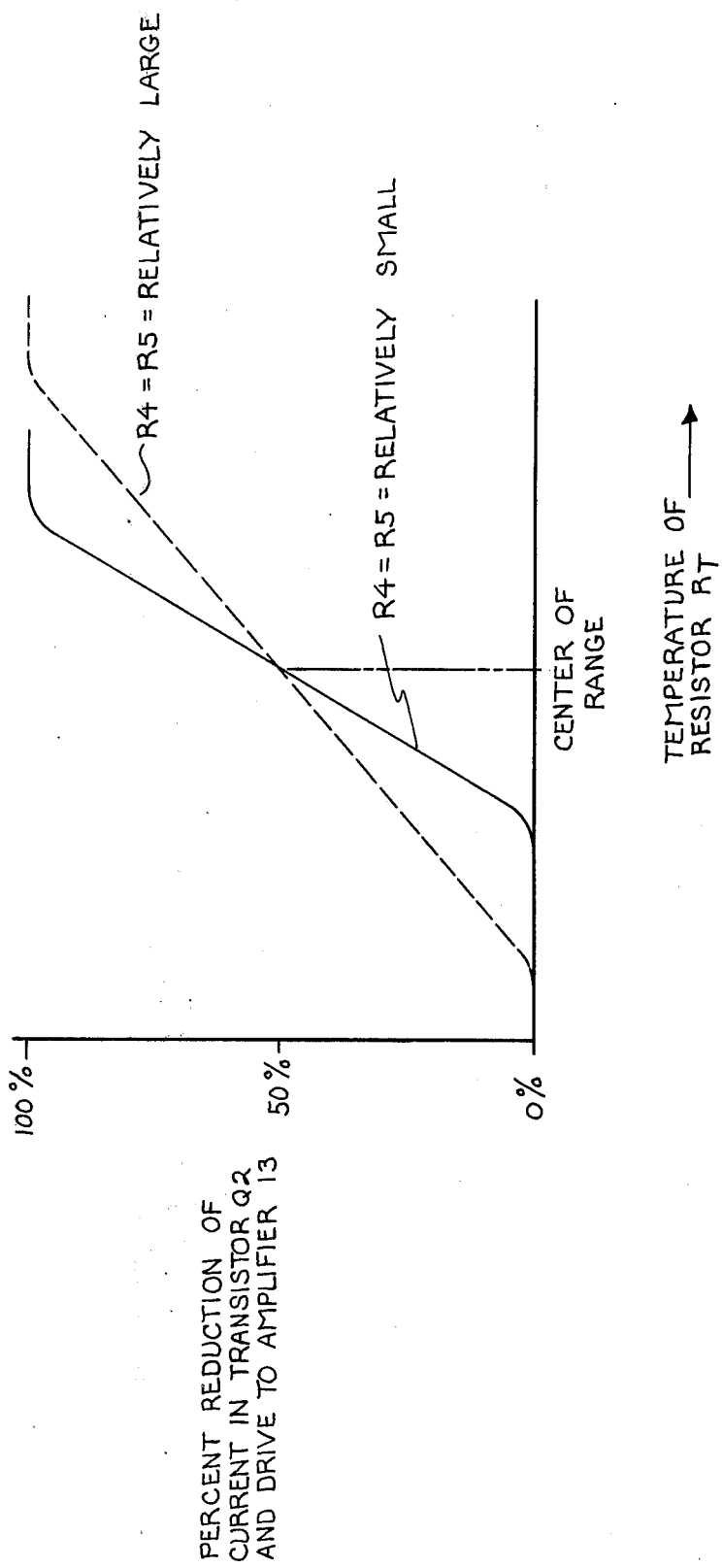

TEMPERATURE CONTROL CIRCUIT

BACKGROUND OF THE INVENTION

My invention relates to a temperature control circuit, and particularly to a temperature control circuit for controlling the output power of electronic equipment as an inverse function of sensed temperature.

In a majority of or almost all present-day electronic equipment, particularly radio transmitters, all of the amplifiers and power amplifiers are solid state devices or transistors. Such devices are very sensitive to heat, so that if their temperature increases, their anticipated life decreases by a factor much larger than the temperature increase factor. For example, the anticipated life of a type 2N6201 transistor is 10 million hours at a junction temperature of 100 degrees C. If this temperature is increased fifty percent to 150 degrees C, the anticipated life of the transistor is decreased by ninety percent to 1 million hours. Therefore, control of the transistor temperature is very important.

Accordingly, a primary object of my invention is to provide a new and improved circuit for controlling the temperature of a transistor.

Another object of my invention is to provide a new and improved circuit for maintaining the temperature of a transistor at a desired level.

Where transistors are used in electronic apparatus, and particularly in radio transmitters, it is desirable to keep the transistors operating at a reduced power if the transistor temperature rises.

Accordingly, another object of my invention is to provide a temperature control circuit that reduces the current supplied to a transistor in response to a temperature increase so as to keep the transistor and associated apparatus in an operating condition.

Another object of my invention is to provide a temperature control circuit that reduces the current supplied to a transistor in response to a temperature increase so as to keep the equipment utilizing the transistor in an operating condition and also to lower the temperature to increase the life of the transistor.

Another object of my invention is to provide a temperature control circuit that reduces the current supplied to a transistor in response to a temperature increase, and to increase the current supplied to the transistor back to its desired level in response to a temperature decrease.

SUMMARY OF THE INVENTION

Briefly, these and other objects are achieved in accordance with my invention by a control circuit having a differential circuit which is provided with a voltage indicative of transistor temperature and with a voltage indicative of current supplied to the transistor being protected. The output of the differential circuit controls the current supplied to a transistor that drives the transistor being protected. If the temperature rises, the drive transistor current is decreased so that the current in the protected transistor is decreased. This keeps the protected transistor operating, but reduces its temperature. If the temperature falls, the drive transistor current is increased to the preset level that causes the desired current to be supplied to the protected transistor.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

FIG. 2 shows curves for illustrating the operation of my temperature control circuit of FIG. 1.

DESCRIPTION OF THE PREFERRED EMBODIMENT

Figure 1:
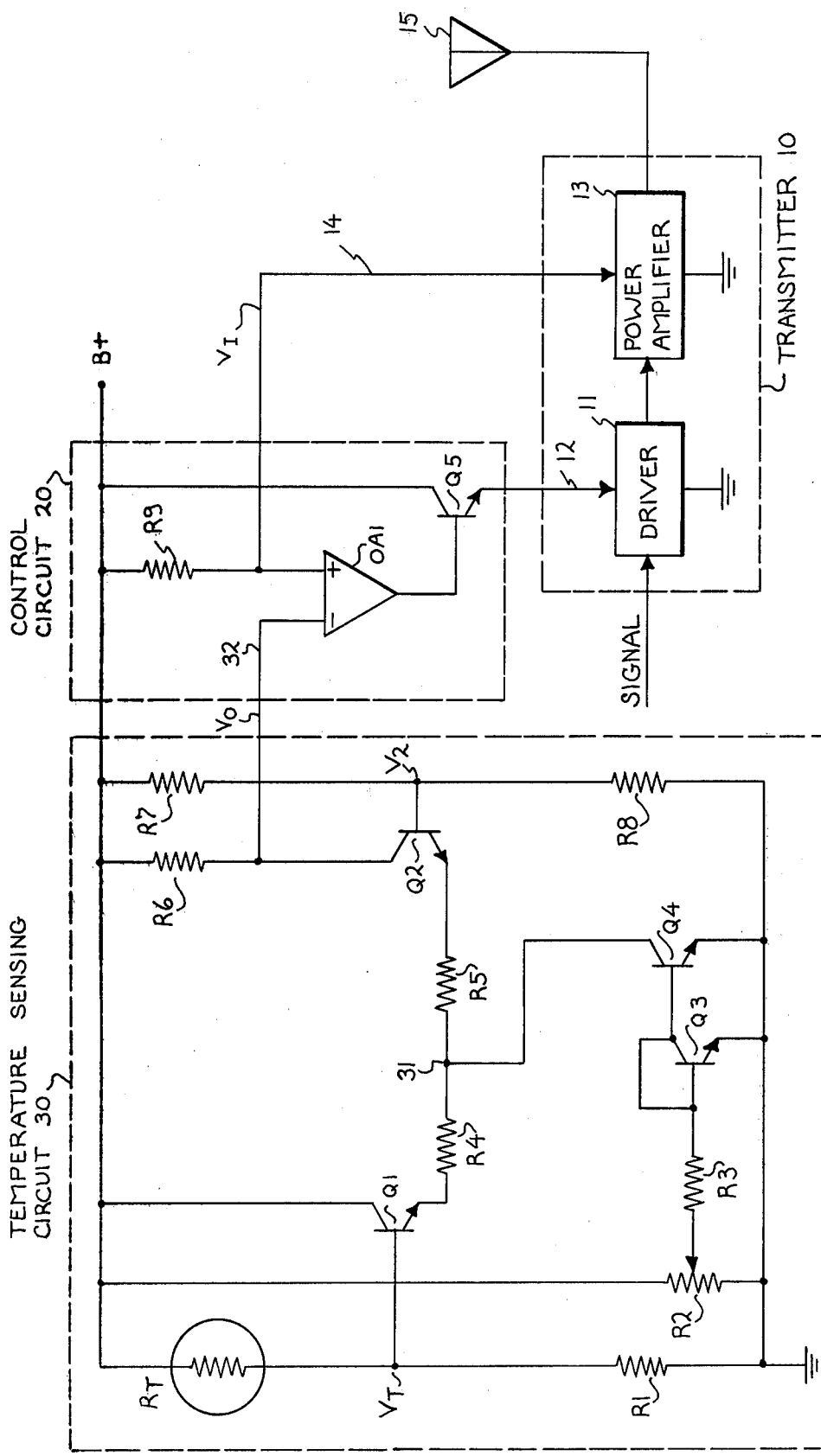
FIG. 1 shows a preferred schematic diagram of a temperature control circuit in accordance with my invention.

In the figure, the transistor or transistors to be protected by my control circuit are assumed, by way of example, to be utilized in a radio transmitter 10 shown enclosed in dashed lines. However, the transistors being protected may be in almost any type of electronic circuit. The transmitter 10 is typically supplied with a modulated signal, such as a radio frequency signal that is frequency modulated. This signal is applied to a driver circuit 11. The driver circuit 11 may comprise one or more transistors or amplifying devices which receive their power from a source of direct current provided from a source B+ and ground or reference by a control circuit 20 and a lead 12. The output of the driver circuit 11 is applied to a power amplifier 13 which may comprise one or more transistors that are to be protected against excessive temperature. These transistors are supplied with direct current from the source B+ through a resistor R9 and a lead 14. As known in the art, the amplifier 13 draws current through the lead 14 to produce output power to an antenna 15 as a function of the drive signal from the driver circuit 11. As mentioned earlier, it is very desirable that the temperature of the transistors in the power amplifier 13 be protected against excessive heat so as to maintain or extend their life. However, it is also desirable that they continue to operate so that the transmitter 10 is functional even under high temperature conditions. By reducing the drive signal applied to the power transistors, their temperature can be reduced, thereby protecting them. Once the condition which caused the high temperature is eliminated, it is desirable that the drive signal again be increased to its normal value. This is achieved by my temperature control circuit.

My temperature control circuit comprises a control circuit 20 which is shown enclosed in dashed lines. The circuit 20 comprises an operational amplifier OA1 connected as a voltage differential circuit. The plus input of the amplifier OA1 is connected to the resistor R9 on the side nearer the power amplifier 13. The resistor R9 is relatively small, and provides a voltage $V_I$ indicative of the current supplied through the lead 14 to the power transistors in the amplifier 13. As this current increases, the voltage $V_I$ decreases; and as this current decreases, the voltage $V_I$ increases. The minus input of the amplifier OA1 is provided with a voltage $V_O$ present on an output lead 32 of a temperature sensing circuit 30. The output of the amplifier OA1 is applied to the base of a transistor Q5 to control the current supplied from the source B+ through the collector-emitter path of the transistor Q5 and the lead 12 to the driver transistors in the driver circuit 11. As is known in the art, when the voltage $V_O$ at the minus input of the amplifier OA1 exceeds the voltage $V_I$ at the plus input of the amplifier OA1, the output of the amplifier OA1 is zero or a minus value. Hence, the transistor Q5 is turned off, and no direct current is supplied over the lead 12 to the driver circuit 11. When the voltage $V_I$ at the plus input of the amplifier OA1 exceeds the voltage $V_O$ at the minus input of tha amplifier OA1, the output of the amplifier OA1 is positive. This causes the transistor Q5 to conduct and supply current over the lead 12 to the transistors in the driver circuit 11. The amount of this current is determined by or is proportional by some ratio to the amount that the voltage $V_I$ at the plus input of the amplifier OA1 exceeds the voltage $V_O$ at the minus input of the amplifier OA1.

The temperature sensing circuit 30 is shown enclosed in dashed lines, and comprises a divider having a temperature sensing resistor or thermistor $R_T$ (whose resistance varies inversely with temperature) connected in series with a resistor R1 (whose resistance is substantially constant with temperature) between the source B+ and ground. The junction of the resistor $R_T$ and the resistor R1 provides a temperature dependent voltage $V_T$ which is supplied to the base of a transistor Q1. Another transistor Q2 is supplied with a base voltage by a divider having two serially connected resistors R7, R8 of the ordinary type which are substantially independent of temperature. The two transistors Q1, Q2 are connected as a differential circuit by respective emitter resistors R4, R5 connected to a common junction 31. The collector of the transistor Q1 is connected to the source B+ and the collector of the transistor Q2 is connected through a resistor R6 to the source B+. The collector voltage of the transistor Q2 provides the output voltage $V_O$. The junction 31 is connected through the collector-emitter path of a transistor Q4 to ground. The collector of the transistor Q3 is connected to the base of the transistor Q4 as shown to form a current mirror circuit. The base of the transistor Q3 is connected to its collector and is connected through a resistor R3 to a movable tap on a resistor R2 connected between the source B+ and ground. The setting of the movable tap on the resistor R2 provides a current which is applied to the current mirror circuit of the transistors Q3, Q4 to determine the total current flowing through the transistors Q1, Q2 and the junction 31 to ground. This total current determines the minimum possible level of the output voltage $V_O$. Moving this tap up increases the total current; moving this tap down decreases the total current. The resistors R4 and R5 are preferably made equal, and their size determines the range of temperature control provided by the sensing circuit 30. If the resistors R4, R5 are made larger, the range is greater; if the resistors R4, R5 are made smaller, the range is smaller. The ratio of current flowing through the transistors Q1, Q2 is determined by the temperature dependent voltage $V_T$ on the base of the transistor Q1 with respect to the temperature independent voltage $V_2$ on the base of the transistor Q2. The voltage $V_2$ on the base of the transistor Q2 is determined by the ratio of the resistors R7, R8 and this voltage $V_2$ determines the center of the range of temperature control. If the voltage $V_T$ changes in the same direction as temperature changes, an increase in the voltage $V_2$ raises the center of the temperature range and a decrease in the voltage $V_2$ lowers the center of the temperature range.

When my circuit is operating, the temperature of heat sensitive resistor $R_T$ determines its resistive magnitude in an opposite or inverse manner. This magnitude determines the voltage $V_T$ which, in turn, determines the amount of current flowing through the transistor Q1. This current, subtracted from the total current which is set by the tap on the resistor R2 and which flows through the junction 31, determines the amount of current flowing through the transistor Q2. The current through the transistor Q2 determines the voltage drop across the resistor R6 and hence the output voltage $V_O$. As the temperature of the resistor $R_T$ increases, the voltage $V_T$ increases and the output voltage $V_O$ increases; and as the temperature of the resistor $R_T$ decreases, the voltage $V_T$ decreases and the output voltage $V_O$ decreases. The minimum output voltage $V_O$ is set by the tap on the resistor R2. If this output voltage $V_O$ is less than the voltage $V_I$ determined by the direct current supplied over the lead 14, the amplifier OA1 produces a positive voltage that provides direct current to the driver transistors. This current is determined by a desired operating temperature for the thermistor $R_T$ and the desired drive signal applied to the power amplifier 13. I prefer that the temperature sensitive resistor $R_T$ be close to the power transistors, and preferably be mounted on their heat sink. If the power transistors get warmer, such as if the transmitter 10 is moved to a hot location, the magnitude of the resistor $R_T$ decreases. This raises the voltage $V_T$ and causes the transistor Q1 to conduct more heavily. This reduces the current through the transistor Q2 and raises the output voltage $V_O$ from its minimum set level. The minus input of the amplifier OA1 likewise is raised. This reduces the positive output of the amplifier OA1, with the result that the transistor Q5 supplies less current over the lead 12. This reduces the power of the driver transistors, and hence the drive signal applied to the power amplifier 13. Thus, the power transistors receive less drive signal, and hence dissipate less power, and have an opportunity to cool off. If the transistors in the amplifier 13 do not cool off sufficiently, the minus input of the amplifier OA1 becomes increasingly positive, and this reduces the drive transistor current still further. If desired, the drive transistor current can be cut off entirely. However, if the drive current for the driver transistors is reduced sufficiently to cause the power transistors to cool, this cooling causes the magnitude of the temperature sensitive resistor $R_T$ to increase. This decreases the voltage $V_T$, so that the transistor Q1 conducts less current and the transistor Q2 conducts more current. This causes the voltage $V_O$ to decrease. A decrease in the voltage $V_O$ causes the amplifier OA1 to produce a more positive output once again that increases the drive signal, which in turn increases the power of the transistors in the power amplifier 13. The allowable minimum of the voltage $V_O$ (and hence the maximum output power) is set by the tap of the resistor R2.

This operation is illustrated by the two curves in FIG. 2 which show the percent reduction of current in the transistor Q2, and hence the reduction in drive applied to the power amplifier 13, plotted against the temperatures of the resistor $R_T$. The solid curve shows the temperature range between 0 and 100% reduction to be relatively small for relatively small values of the resistors R4, R5, and the dashed curve shows the temperature range between 0 and 100% reduction to be relatively large for relatively large values of the resistors R4, R5. The center of the range can be moved upward by making the voltage $V_2$ larger relative to the voltage $V_T$, and can be moved downward by making the voltage $V_2$ smaller relative to the voltage $V_T$. The center of the range should provide a 50% reduction, and this is assured by making the resistors R4, R5 (in the temperature circuit 30) equal to each other.

It will thus be seen that I have provided a new and improved control circuit which provides a smooth or continuous control of the current supplied to the drive transistors over a desired temperature range which, in turn, provide a drive signal to power transistors that must be protected from excessive heat. While I have shown only one embodiment of my invention, persons skilled in the art will appreciate the modifications that may be made. For example, the frequency of the signal applied to the driver 11 for subsequent application to the amplifier 13 may be any frequency desired. And the polarities of the various control signals in my circuit 20 may be changed as long as the control signals protect the power transistors against heat by reducing the drive power as described. Therefore, while my invention has been described with reference to a particular embodiment, it is to be understood that modifications may be made without departing from the spirit of the invention or from the scope of the claims.

What I claim as new and desire to secure by Letters Patent of the United States is:

1. An improved circuit for controlling the magnitude of current supplied to a driver circuit which delivers an alternating current signal to a power amplifier, said improved circuit comprising:
   a. a temperature sensing circuit comprising a first differential circuit for sensing the difference between a voltage provided by a temperature sensitive resistor in a resistive divider and a voltage provided by a temperature insensitive resistive divider for producing a temperature voltage that varies as a function of the change in temperature of said temperature sensitive resistor, said first differential circuit including current control means that determine the minimum value of said temperature voltage;
   b. a source of current for said driver circuit and said power amplifier;
   c. a second differential circuit having first and second inputs and an output which produces a difference signal that varies as a function of the relative magnitude of voltages applied to said first and second inputs;
   d. first means connecting said temperature sensing circuit to said first input of said second differential circuit for applying said temperature voltage thereto;
   e. second means connected to said source of current for said power amplifier for producing a second voltage that varies as a function of the current supplied to said power amplifier;
   f. third means connecting said second means to said second input of said second differential circuit for applying said second voltage thereto;
   g. and fourth means connected to said output of said second differential circuit and to said driver circuit for controlling the current supplied to said driver circuit as a function of said difference signal.

2. The improved circuit of claim 1 wherein said second means comprise a relatively small resistor connected between said current source and said power amplifier.

3. The improved circuit of claim 1 wherein said first differential circuit comprises two transistors having a common current path, and wherein said current control means permit the common current through said common current path to be set at a predetermined magnitude.

4. The improved circuit of claim 1 wherein said second means comprise a relatively small resistor connected between said current source and said power amplifier,
   wherein said first differential circuit comprises two transistors having a common current path, and wherein said current control means permit the common current through said common current path to be set at a predetermined magnitude.

5. The improved circuit of claim 1 wherein said temperature voltage varies in the same direction as changes in temperature, wherein said second voltage varies in the opposite direction to changes in supplied current, and wherein the current controlled by said fourth means is decreased in response to said temperature voltage exceeding said second voltage.

6. In a radio transmitter having an output amplifier, a driver circuit connected to the input of said output amplifier, and a source of direct current for said output amplifier and said driver circuit, a temperature control circuit for regulating the amount of direct current supplied to said output amplifier and said driver circuit, said temperature control circuit comprising:
   a. first means for sensing the temperature of a selected part of said radio transmitter and including a differential circuit for producing a temperature dependent voltage and a relatively temperature independent voltage to produce a first voltage whose magnitude varies as a function of the magnitude of sensed temperature, said differential circuit of said first means including adjustable means for determining the minimum magntiude of said temperature variable first voltage;
   b. second means connected between said source of direct current and said output amplifier for supplying current to said output amplifier and for producing a second voltage whose magnitude varies as a function of the magnitude of direct current supplied to said output amplifier;
   c. an operational amplifier having a minus input connected to said first means, a plus input connected to said second means, and an output that produces an output voltage that increases in response to said second voltage at said plug input exceeding said first voltage at said minus input and that decreases in response to said first voltage at said minus input exceeding said second voltage at said plus input;
   d. and a current control device having a controlled current path connected between said source of direct current and said driver circuit and having a control input connected to said output of said operational amplifier for controlling the current through said current path as a function of said output voltage produced by said operational amplifier.

7. In a radio transmitter having an output amplifier, a driver circuit connected to the input of said output amplifier, and a source of direct current for said output amplifier and said driver circuit, a temperature control circuit for regulating the amount of direct current supplied to said output amplifier and said driver circuit, said temperature control circuit comprising:
   a. first means for sensing the temperature of a selected part of said radio transmitter and including a differential circuit for producing a temperature dependent voltage and a relatively temperature independent voltage to produce a first voltage whose magnitude varies in the same direction as the magnitude of sensed temperature, said differential circuit of said first means comprising two transistors respectively supplied with said temperature dependent voltage and said temperature independent voltage, said transistors having a common current path, and means for adjusting the current through said common current path and thereby determine the minimum value of said first voltage;

b. second means connected between said source of direct current and said output amplifier for supplying current to said output amplifier and for producing a second voltage whose magnitude varies in the opposite direction to the magnitude of direct current supplied to said output amplifier;

c. an operational amplifier having a minus input connected to said first means, a plus input connected to said second means, and an output that produces an output voltage that increases in response to said second voltage at said plus input exceeding said first voltage at said minus input and that decreases in response to said first voltage at said minus input exceeding said second voltage at said plus input;

d. and a current control device having a controlled current path connected between said source of direct current and said driver circuit and having a control input connected to said output of said operational amplifier for controlling the current through said current path as a function of said output voltage produced by said operational amplifier.

8. The temperature control circuit of claim 7 wherein said second means comprise a resistor of relatively small magnitude, and wherein said plus input of said operational amplifier is connected to said resistor on the side thereof connected to said output amplifier.

9. The temperature control circuit of claim 8 wherein said first means senses the temperature of said output amplifier.

* * * * *